United States Patent
Pichai et al.

(10) Patent No.: US 12,464,672 B1
(45) Date of Patent: Nov. 4, 2025

(54) HYBRID IMMERSION COOLING SYSTEM

(71) Applicant: Equinix, Inc., Redwood City, CA (US)

(72) Inventors: Tikhon Suresh Pichai, Simpsonville, SC (US); My Dinh Truong, Pacifica, CA (US); Douglas James Asay, San Jose, CA (US); David Buck Mar, San Jose, CA (US); Bhavin Raju Shah, Sunnyvale, CA (US)

(73) Assignee: Equinix, Inc., Redwood City, CA (US)

( * ) Notice: Subject to any disclaimer, the term of this patent is extended or adjusted under 35 U.S.C. 154(b) by 93 days.

(21) Appl. No.: 18/193,432

(22) Filed: Mar. 30, 2023

Related U.S. Application Data

(60) Provisional application No. 63/362,182, filed on Mar. 30, 2022.

(51) Int. Cl.
H05K 7/20 (2006.01)
(52) U.S. Cl.
CPC ....... H05K 7/20236 (2013.01); H05K 7/2029 (2013.01); H05K 7/20409 (2013.01); H05K 7/20772 (2013.01); H05K 7/20809 (2013.01)
(58) Field of Classification Search
CPC .......................................... H01L 23/34–4735
See application file for complete search history.

(56) References Cited

U.S. PATENT DOCUMENTS

| | | | | |
|---|---|---|---|---|
| 3,616,533 A * | 11/1971 | Heap | ........................ | H05K 3/34 228/180.1 |
| 5,000,256 A * | 3/1991 | Tousignant | ............. | H01L 23/42 165/104.19 |
| 9,069,535 B2 * | 6/2015 | Degner | ................... | G02B 6/001 |
| 10,111,363 B2 * | 10/2018 | Chen | ........................ | B23P 15/26 |
| 2005/0128710 A1 * | 6/2005 | Beitelmal | .......... | H05K 7/20445 361/709 |
| 2008/0237845 A1 * | 10/2008 | Kim | ........................ | G06F 1/203 257/715 |
| 2009/0199999 A1 * | 8/2009 | Mitic | .................... | F28F 13/187 29/854 |
| 2014/0102672 A1 * | 4/2014 | Campbell | .......... | H05K 7/20836 165/104.19 |
| 2015/0109735 A1 * | 4/2015 | Campbell | ............ | H05K 7/2079 361/700 |
| 2019/0368826 A1 * | 12/2019 | Flowers | .................... | F16F 9/42 |

OTHER PUBLICATIONS

"Emergence and Expansion of Liquid Cooling in Mainstream Data Centers," White Paper Developed by ASHRAE Technical Committee 9.9, Mission Critical Facilities, May 5, 2021, 32 pp.
Sivashanmugam, "Chapter 14—Application of Nanofluids in Heat Transfer," An Overview of Heat Transfer Phenomena, Oct. 31, 2012, pp. 411-440.

* cited by examiner

Primary Examiner — Zachary Pape
(74) Attorney, Agent, or Firm — Shumaker & Sieffert, P.A.

(57) ABSTRACT

A system including a computing device including a chassis and one or more components. The computing device also including a chip assembly positioned within the chassis. The chip assembly including at least one component of the one or more components of the computing device and a pressure chamber adjacent to the at least one component, wherein the pressure chamber is hermetically sealed and contains a fluid mixture configured to facilitate convective cooling of the at least one component.

20 Claims, 8 Drawing Sheets

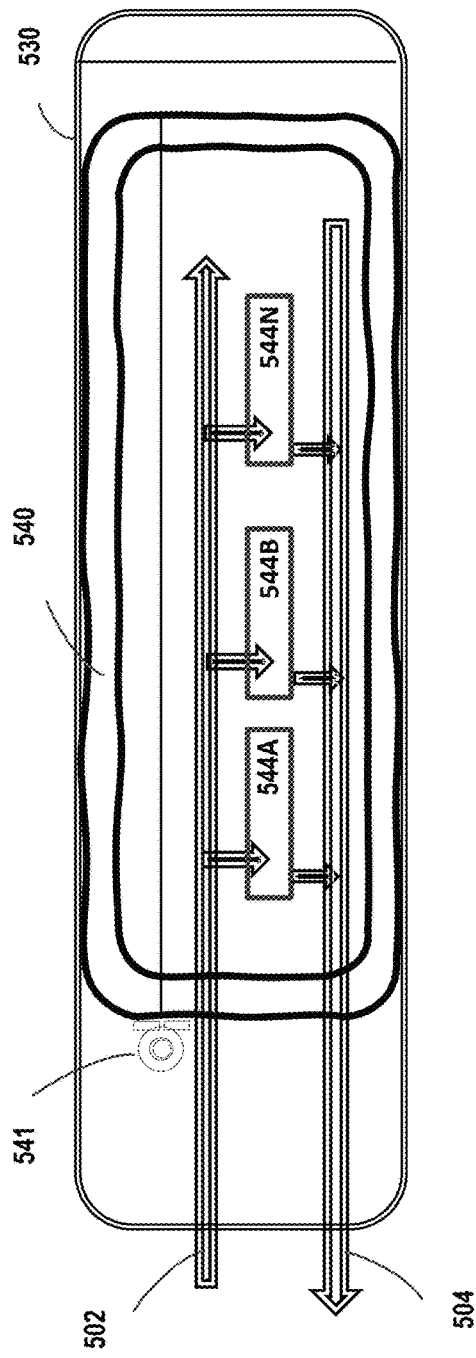
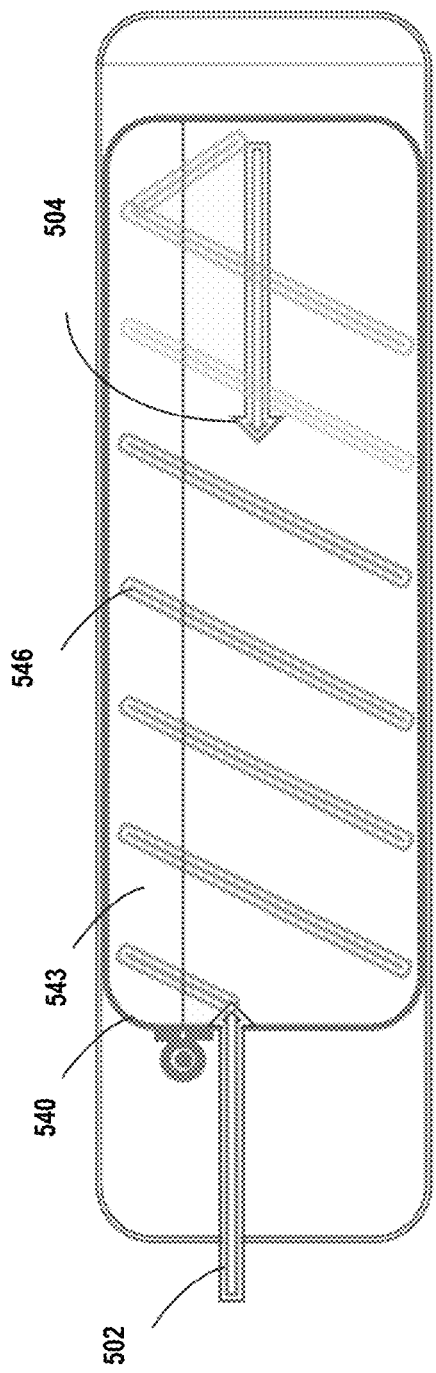
FIG. 5A
FIG. 5B

COOL AT LEAST ONE COMPONENT OF ONE OR MORE COMPONENTS OF COMPUTING DEVICE VIA A CHIP ASSEMBLY POSITIONED WITHIN A CHASSIS OF THE COMPUTING DEVICE INCLUDING A PRESSURE CHAMBER CONTAINING A FLUID MIXTURE CONFIGURED TO FACILITATE CONVECTIVE COOLING OF THE AT LEAST ONE COMPONENT — 702

FIG. 7

HYBRID IMMERSION COOLING SYSTEM

This application claims the benefit of U.S. Provisional Application Ser. No. 63/362,182 (filed Mar. 30, 2022), which is entitled "HYBRID IMMERSION COOLING SYSTEM" and is incorporated by reference herein in its entirety.

TECHNICAL FIELD

The disclosure relates to data center refrigeration systems and, more specifically, to refrigeration systems for computing devices in data centers.

BACKGROUND

Ensuring ambient temperatures within data centers for effective computer processor operations is a significant cost for data center providers. Processors used in high performance computing servers generate a significant amount of heat during operation. Processors typically must operate in a range of ambient temperatures to prevent failure due to overheating. Liquid cooling systems that supply liquid refrigerant to the processors efficiently transfer heat away from the processors.

SUMMARY

In general, techniques are described for cooling a computing device in a data center using a combination of single-phase and dual-phase immersion cooling. For example, an immersion box surrounds a portion of a server or switch containing components for cooling. The immersion box may include a cooling jacket carrying a coolant. The components of the server inside the immersion box may be immersed in a technical fluid. In some examples, the technical fluid may be a single-phase immersion fluid. The components of the server inside the immersion box may include one or more components that require cooling, e.g., central processing units (CPUs), graphical processing units (GPUs), memory modules, or other components. A hermetically sealed pressure chamber may be attached to one or more components (e.g., each GPU may be attached to its own corresponding pressure chamber), wherein the hermetically sealed pressure chambers contain a fluid mixture. The fluid mixture may be configured to boil at one or more temperatures to facilitate two-phase cooling of the components. The fluid mixture may also contain micro-fined metal particles in suspension to both facilitate nucleation of the fluid mixture, as well as mitigate the Leidenfrost effect between the components and the fluid mixture. In some examples, each pressure chamber is surrounded by a cooling chamber, wherein one or more tubes transfer coolant from the cooling jacket to the cooling chamber.

In some examples a system includes: a computing device comprising a chassis and one or more components; and a chip assembly positioned within the chassis, the chip assembly including: at least one component of the one or more components of the computing device; and a pressure chamber adjacent to the at least one component, wherein the pressure chamber is hermetically sealed and contains a fluid mixture configured to facilitate convective cooling of the at least one component.

In some examples a chip assembly includes: at least one component of a plurality of components of a computing device; a pressure chamber adjacent to the at least one component, wherein the pressure chamber is hermetically sealed and contains a fluid mixture configured to facilitate convective cooling of the at least one component.

In some examples, a method includes cooling at least one component of one or more components of a computing device via a chip assembly positioned within a chassis of the computing device, wherein the chip assembly includes: the at least one component of the one or more components of the computing device; and a pressure chamber adjacent to the at least one component, wherein the pressure chamber is hermetically sealed and contains a fluid mixture configured to facilitate convective cooling of the at least one component.

The details of one or more examples are set forth in the accompanying drawings and the description below. Other features, objects, and advantages will be apparent from the description and drawings, and from the claims.

BRIEF DESCRIPTION OF DRAWINGS

FIG. 5A is a block diagram illustrating an example immersion box with example coolant pumps, in accordance with techniques described herein.

FIG. 5B is a block diagram illustrating the example immersion box of FIG. 5A with a cooling coil inside the immersion box, in accordance with the techniques described herein.

FIG. 7 is a conceptual diagram showing an example hybrid cooling system, in accordance with techniques described herein.

DETAILED DESCRIPTION

Figure 1A:
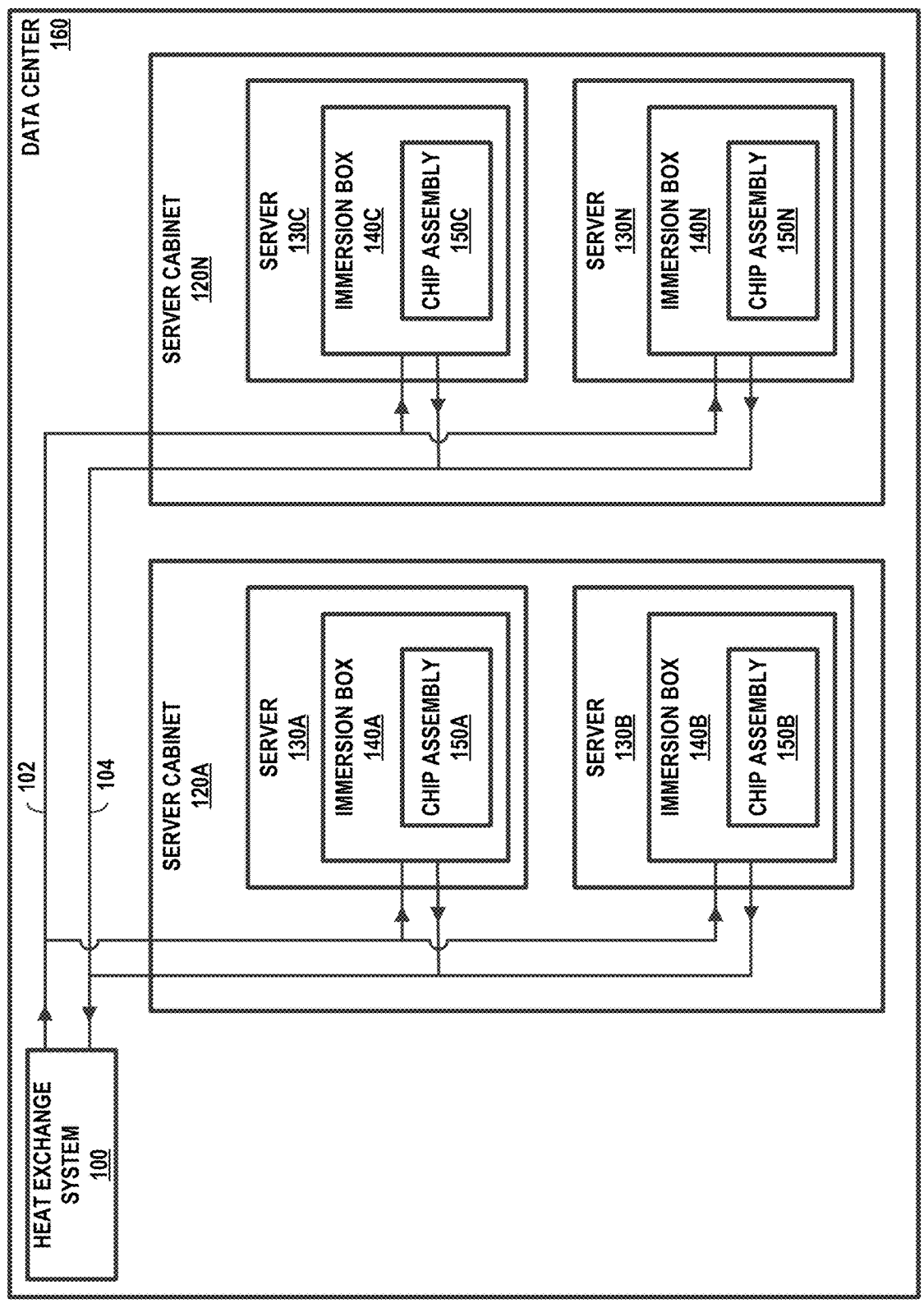
FIG. 1A is a block diagram illustrating a high-level view of an example data center that includes one or more immersion boxes and chip assemblies within one or more servers, in accordance with techniques described herein.

With ever-increasing heat loads of computer components, new methods of cooling computing components are needed, especially for data centers which house multiple servers. Current methods include immersing an entire server chassis, along with its components, in a tank of immersion fluid (e.g., a dielectric liquid). Full immersion in an immersion fluid has many downsides. The amount of fluid needed is costly, as is the cost of changing all server/computer components to materials and designs that account for submersion (e.g., liquid-tight seals, non-corroding materials, material compatibility with dielectric liquid). Optical components of the server may not function properly in an immersion fluid with a different refractive index than air. It is also difficult to perform maintenance or repair when the entire chassis is submerged. The tank itself may also be very large and heavy, requiring further cost to support the extra weight.

In some examples of this disclosure, systems, devices, and methods are described to reduce the amount of fluid needed, as well as reduce the amount of material changes to existing computing systems, and prevent malfunctioning of optical components of a computing device. For example, a server may include an immersion box, wherein the immersion box surrounds a portion of the computing components of the server. In some examples, the immersion box surrounds only those computing components of the server that produce a threshold amount of heat during operation. In some examples, the immersion box does not surround optical components of the server. Computing components within the immersion box may be submerged in an immersion fluid.

The immersion box may include a cooling jacket through which a coolant or refrigerant flows to cool the internals of the immersion box, including the immersion fluid. By surrounding only a portion of the server computing components with an immersion box, less immersion fluid is needed, fewer design considerations need to be made for server components, and optical components may function as intended. In some examples, the immersion box is easily accessed for maintenance. For example, the immersion box may have a clam shell design, where the lid may be lifted to access internal components. In some examples the immersion box may be configured to slide in and out of the server for easy access.

An immersion fluid may cool server components using single-phase or two-phase cooling. In single-phase immersion cooling the immersion fluid remains in a liquid state during operation of the server. A temperature gradient develops between the liquid in close proximity to heat-generating components of the server and the liquid distant from the heat-generating components. The temperature gradient facilitates convective heat transfer of heat away from server components. In two-phase immersion cooling, the immersion fluid boils at the point of contact with one or more of the heat-generating components of the server. This boiling may facilitate rapid removal of heat from those server components, however, due to the Leidenfrost effect, heat transfer between the server components and the immersion fluid may stop entirely. In addition, immersion fluids are typically harmful to the environment as contributors to global warming, and some immersion fluid in gaseous form tends to escape the tub.

In some examples of this disclosure, systems, devices, and methods are described to make use of both single-phase and two-phase immersion cooling while counteracting the Leidenfrost effect and preventing the escape of harmful gases into the atmosphere. For example, a server may include one or more components (e.g., processors), that produce a large amount of heat. The server may also include one or more pressure chambers connected to, or adjacent and in contact with, the one or more components. In some examples, each of the one or more components is connected to a corresponding pressure chamber. In some examples, only a select number of the one or more components is connected to a corresponding pressure chamber. In some examples, only the high thermal design power (TDP) components of the server are connected to corresponding pressure chambers. Each component that requires cooling may be connected to its own pressure chamber to provide cooling. The one or more pressure chambers may provide cooling to their corresponding components through two-phase cooling of a fluid mixture within the one or more pressure chambers. For example, the one or more pressure chambers may be filled with a fluid mixture configured to boil at one or more temperatures to facilitate two-phase cooling of the components. The fluid mixture may also contain micro-fined metal particles in suspension to both facilitate nucleation of the fluid mixture, as well as mitigate the Leidenfrost effect between the components and the fluid mixture (e.g., the Leidenfrost effect between the fluid mixture and the internal wall of the pressure chamber directly adjacent the one or more components). The pressure chambers may be hermetically sealed to avoid leakage of the fluid mixture. In this way, aspects of this disclosure may include the rapid heat transfer of two-phase cooling on the components of the server that produce the most heat, without suffering from Leidenfrost problems and reducing the risk of two-phase coolant being released to the atmosphere.

In some examples, the hermetically sealed pressure chambers may be connected to components of the server inside the immersion box, and components of the server outside the immersion box. In some examples, the hermetically sealed pressure chambers may be connected to components of a data center external of the server. For example, one or more hermetically sealed pressure chambers may be connected to one or more components of a server cabinet, coolant distribution unit, and/or as an independent cabinet form factor.

In some examples, the components may be disposed in an immersion box inside the server. The immersion box may be filled with a single-phase immersion fluid that facilitates heat transfer away from server computing components. In some examples heat may transfer from the components through an attached pressure chamber into the fluid mixture via two-phase cooling, and heat may transfer from the fluid mixture through the pressure chamber into the single-phase immersion fluid via single-phase cooling. In some examples, the immersion box may include a cooling jacket filled with refrigerant that circulates to one or more heat exchangers or refrigeration systems outside of the server. The refrigerant may cool the single-phase immersion fluid via single-phase and/or two phase cooling.

In some examples, the pressure chambers may be surrounded by one or more cooling chambers in fluid communication with the cooling jacket. After the refrigerant has circulated through the cooling jacket to remove heat from the single-phase immersion fluid, the refrigerant may circulate through the one or more cooling chambers to directly cool the pressure chambers—and thereby the attached components.

FIG. 1A is a block diagram illustrating a high-level view of example data center 160 that includes one or more immersion boxes 140 and chip assemblies 150 within one or more computing devices, in accordance with techniques described herein.

Computing devices include physical devices including servers 130, such as x86 server devices; physical network devices such as switches, routers, firewalls; and other computing devices. For purposes of example, the term "server" will be used throughout this disclosure, but the techniques can apply to other types of computing devices.

In the example of FIG. 1A, data center 160 includes a plurality of server cabinets 120A-120N (together server cabinets 120). Each server cabinet 120A-120N includes a plurality of servers 130A-130N (together servers 130), and each server includes a corresponding immersion box 140A-

140N (e.g., in the example of FIG. 1A, server cabinet 120A includes server 130A with immersion box 140A and server 130B with immersion box 140B). Each immersion box 140A-140N may surround one or more computing components of the server. In the example of FIG. 1A, chip assembly 150A sits within immersion box 140A.

Although only two server cabinets 120 are pictured, data center 160 may include more or fewer server cabinets 120. Although only two servers 130 are pictured in each of server cabinets 120, each of server cabinets 120 may include more or fewer servers. Although only one chip assembly of chip assemblies 150 is pictured in each of immersion boxes 140, each of immersion boxes 140 may include a plurality of chip assemblies 150. Furthermore, although chip assemblies 150 are only depicted within immersion boxes 140, in some examples chip assemblies 150 may be positioned outside immersion boxes 140, outside servers 130, and/or outside server cabinets 120 as part of the components that make up one or more server cabinets 120, servers 130, or any other computing component of data center 160. For example, a computing device (e.g., server 130A) may include components inside a chassis of server 130A and components outside the chassis of server 130A. Chip assemblies 150 may include the components inside the chassis of server 130A and/or the components outside the chassis of server 130A.

Data center 160 also includes a heat exchange system 100 to keep the components of servers 130 cool and operating efficiently. Heat exchange system 100 may circulate coolant or refrigerant to and from servers 130 via cold coolant line 102 and warm coolant return 104. The words "cold" and "warm" in this context refer to relative temperatures of one another, as the coolant that leaves heat exchange system 100 and enters each of servers 130 is colder than the coolant that leaves each of servers 130 and returns to heat exchange system 100. The coolant may be any single-phase or two-phase fluid configured for use in data center cooling applications. For example, the coolant may be water (e.g., facility water), a propylene glycol and water mixture (e.g., PG25), an aromatic (e.g., synthetic hydrocarbons, diethyl benzene, dibenzyl toluene, diaryl alkyl, partially hydrogenated terphenyl, alkylated benzene), an aliphatic (e.g., paraffinic hydrocarbons, iso-paraffinic hydrocarbons), silicones (e.g., dimethyl- and methyl phenyl-poly), fluorocarbons (e.g., perfluorocarbons, hydrofluoroethers, perfluorocarbon ethers), or other single- or two-phase cooling fluids.

Heat exchange system 100 may include one or more pumps, drivers, condensers, heat exchangers, cooling towers, and other systems for receiving warm coolant via warm coolant return 104 and outputting cold coolant via cold coolant line 102. For example, heat exchange system 100 may be connected to a cold water line of a facility in which data center 160 is located. Heat exchangers of heat exchange system 100 may transfer heat from warm coolant return 104 to the cold facility water. In some examples, heat exchange system 100 may circulate facility water as the coolant.

Pumps of heat exchange system 100 may circulate coolant to servers 130, immersion boxes 140, and chip assemblies 150. In some examples, immersion boxes 140 include a cooling jacket through which the coolant flows, thereby cooling the interiors of immersion boxes 140. In some examples the coolant also flows to one or more of chip assemblies 150 to facilitate direct-to-chip (DTC) cooling. For example, a cooling chamber may surround each of chip assemblies 150 to facilitate heat transfer away from each of chip assemblies 150. In some examples, a single cooling chamber may surround multiple chip assemblies of chip assemblies 150 within a single immersion box of immersion boxes 140. In some examples, a single cooling chamber may surround only a single chip assembly. In some examples, an immersion box of immersion boxes 140 may include a single cooling chamber or multiple cooling chambers, each cooling chamber surrounding a single chip assembly or multiple chip assemblies. In some examples, the coolant flows through the cooling jacket of an immersion box before flowing to the one or more cooling chambers surrounding one or more chip assemblies within that immersion box. In some examples, the coolant flows to the one or more cooling chambers surrounding one or more chip assemblies within an immersion box before flowing through the cooling jacket of that immersion box. The coolant may flow to each cooling chamber within an immersion box in series or in parallel. For example, the coolant may flow to one or more cooling chambers surrounding one or more chip assemblies and the cooling jacket in parallel, rather than passing through either the cooling jacket first or the one or more cooling chambers first.

In some examples where coolant flows through the cooling jacket and one or more components (e.g., to one or more cooling chambers surrounding the one or more components) of the server in series, the order in which coolant flows through the different components or the cooling jacket may be based on the heat load each component is expected to produce. As coolant flows through the system, it absorbs more heat from components of the system, and becomes less efficient at absorbing more heat from the system. In some examples, the coolant may be configured to flow through components in order of highest heat load to lowest heat load. In some examples, the coolant may be configured to flow through components in order of lowest head load to highest. Any order may be contemplated depending on which components are desired to encounter the coldest coolant.

Each of chip assemblies 150 may include a component of their respective server and a pressure chamber as discussed in greater detail with respect to FIGS. 6A and 6B below. In some examples, the server components of chip assemblies 150 may be high TDP components. In some examples, high TDP components include processors of the servers (e.g., CPUs, GPUs). For ease of description, high TDP components may at times be referred to simply as "processors," although other, non-processing components of servers 130 may also be high TDP components (e.g., memory modules). The pressure chamber of each chip assembly may be attached to the corresponding component of the chip assembly. For example, a pressure chamber of chip assembly 150C may be attached to a corresponding processor of chip assembly C in place of an air heat sink. The pressure chambers may contain a fluid mixture configured to facilitate two-phase cooling of components to which they are attached. In some examples, a pressure chamber may be attached to a corresponding computing component of any of chip assemblies 150, servers 130, and/or data center 160 to facilitate cooling of the corresponding computing component.

Figure 1B:
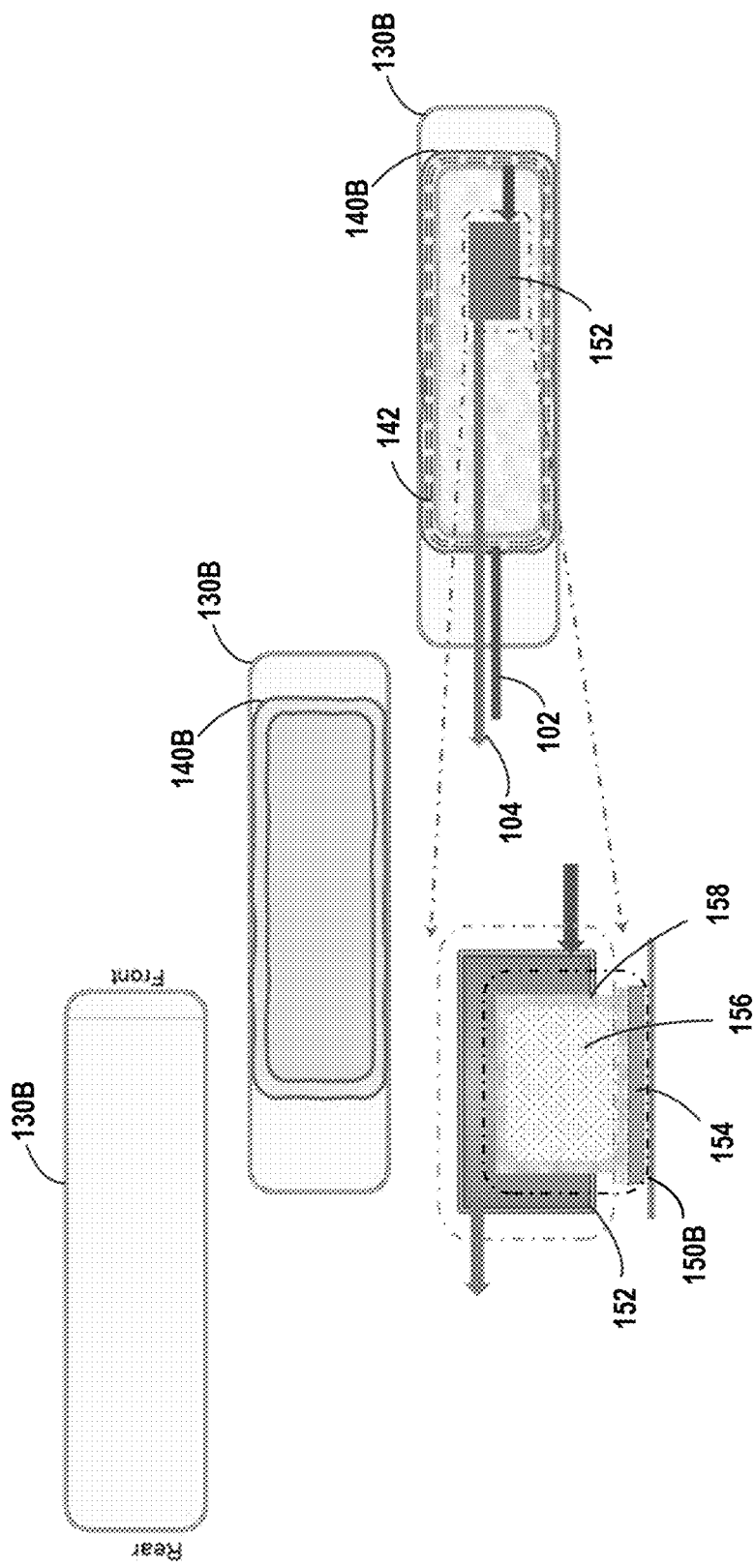
FIG. 1B is a block diagram illustrating sectional views of an example server, immersion box, pressure chamber, and chip assembly, in accordance with techniques described herein.

FIG. 1B is a block diagram illustrating various sectional views of an example server 130B, immersion box 140B, pressure chamber 158, and chip assembly 150B, in accordance with techniques described herein. Although labeled in FIG. 1B as server 130B, immersion box 140B, and chip assembly 150B, any one or more of server 130A-130N, immersion box 140A-140N, and chip assembly 150A-150N may assume the form shown by FIG. 1B.

Server 130B may include a chassis with a front and a rear as shown in FIG. 1B. For example the front of server 130B chassis may face towards the door of a server cabinet in which server 130B sits. The front of server 130B chassis may include a cover that allows access to the internals of server 130B.

Immersion box 140B may be disposed inside the chassis of server 130B. Immersion box 140B may surround one or all of the components of server 130B (e.g., heat-producing components of server 130B). Immersion box 140B may be filled with an immersion fluid to facilitate cooling of the components of server 130B inside immersion box 140B. For example, immersion box 140B may include cooling jacket 142. Cooling jacket 142 may be disposed within the walls of immersion box 140B, and in fluid communication with cold coolant line 102 and warm coolant return 104. Cold coolant flowing into cooling jacket 142 may cool the immersion fluid within immersion box 140B, which in turn cools the components of server 130B inside immersion box 140B.

In the example of FIG. 1B, cooling chamber 152 is disposed within immersion box 140B, and surrounds pressure chamber 158 of chip assembly 150B. Cooling chamber 152 may be in fluid communication with cooling jacket 142. In the example shown in FIG. 1B, cold coolant flows into cooling jacket 142 from cold coolant line 102 before flowing into cooling chamber 152, and then out of cooling chamber 152 to warm coolant return 104. In some examples, cold coolant may flow first to cooling chamber 152, and then to cooling jacket 142. Chip assembly 150B may include pressure chamber 158 and server component 154. Pressure chamber 158 may be filled with fluid mixture 156. Fluid mixture 156 may contain one or more fluids (e.g., coolants/refrigerants), and may also contain fine metal particles suspended within the one or more fluids.

Although chip assembly 150B is depicted in FIG. 1B as inside immersion box 140B, in some examples, one or more chip assemblies may be located inside and/or outside of immersion box 140B. For example, a pressure chamber (e.g., pressure chamber 158) may be attached to a component of server 130B outside of immersion box 140B.

Figure 2A:
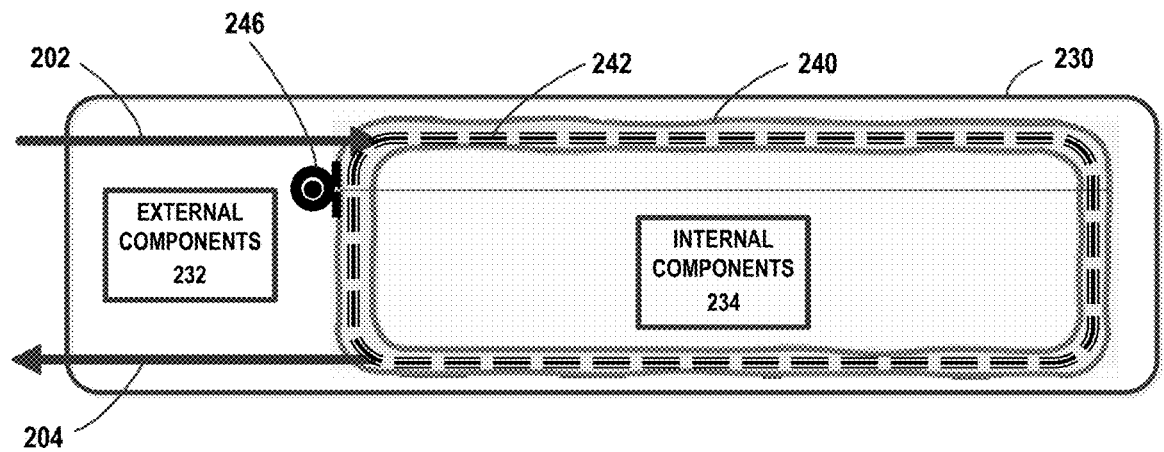
FIG. 2A is a block diagram illustrating an example immersion box within an example server, in accordance with techniques described herein.

FIG. 2A is a block diagram illustrating an example immersion box 240 within an example server 230, in accordance with techniques described herein. Immersion box 240 and server 230 may be substantially similar to immersion boxes 140 and servers 130, respectively, depicted in FIG. 1A.

In the example of FIG. 2A, server 230 contains immersion box 240 configured to cool components (e.g., components 232, 234) of server 230. Some components of server 230 may be housed by immersion box 240 (internal components 234), while other components of server 230 remain outside of immersion box 240 (external components 232). Internal components 234 may include CPUs, GPUs, memory modules, and other heat-producing components of server 230. External components 232 may include components of server 230 that produce negligible heat, or that may not function within immersion box 240. For example, immersion box 240 may be filled with a technical fluid (e.g., an immersion fluid) with a different refractive index than air, and optical components of server 230 may not function properly when immersed in the technical fluid, therefore external components may include the optical components of server 230. Any of external components 232 or internal components 234 may be attached to a corresponding pressure chamber, wherein the pressure chamber is hermetically sealed and filled with a fluid mixture configured to facilitate two-phase cooling of the attached component.

In the example of FIG. 2A, cold coolant 202 flows into immersion box 240, and warm coolant 204 flows out of immersion box 240. Cold coolant 202 may flow from a cold coolant line of a data center into immersion box 240 through a tube fluidly connected to cooling jacket 242 of immersion box 240. Warm coolant 204 may flow out of immersion box 240 through a tube in fluid connection with cooling jacket 242 to a warm return line of the data center. Immersion box 240 includes cooling jacket 242 through which the coolant may flow and thereby transfer heat away from immersion box 240 internals. Cooling jacket 242 may be located at an exterior of immersion box 240. For example, cooling jacket 242 may be located within the walls of immersion box 240. In some examples, cooling jacket 242 may be located along inner surfaces of immersion box 240.

In some examples, immersion box 240 may have a clam-shell design, where immersion box 240 includes hinge 246 and lid for easy access to internals of immersion box 240. In examples where immersion box 240 is filled with a technical fluid, the technical fluid may only come up to the level of the lid or just below to prevent leakage during operation and maintenance. The technical fluid may be any technical fluid, e.g., refrigerant, coolant, dielectric fluid, natural mineral oils, engineered ester-based fluids, etc.

Figure 2B:
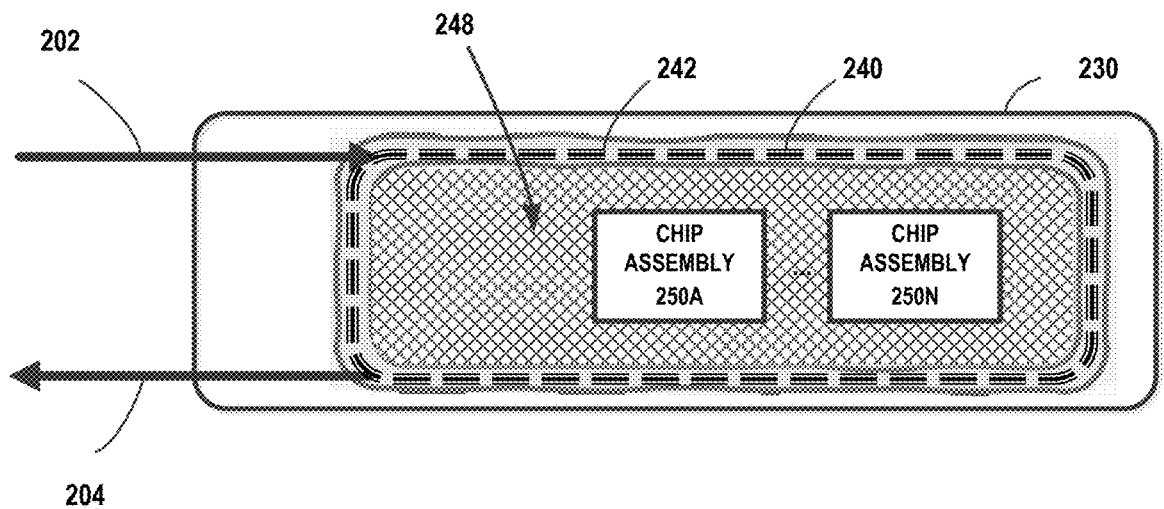
FIG. 2B is a block diagram illustrating example components inside the example immersion box of FIG. 2A, in accordance with techniques described herein.

FIG. 2B is a block diagram illustrating example components inside the example immersion box of FIG. 2A, in accordance with techniques described herein. In the example of FIG. 2B, immersion box 240 is filled with technical fluid 248. In some examples, technical fluid 248 may be a single-phase immersion fluid. Components of server 230 within immersion box 240 may be immersed in technical fluid 248. For example, one or more chip assemblies 250A-250N may be immersed in technical fluid 248. Technical fluid 248 may be cooled by cold coolant 202 flowing through cooling jacket 242. Warm coolant 204 may exit server 230 and remove heat from server 230.

In some examples, chip assemblies 250 may include high TDP components. In some examples, chip assemblies 250 may be attached to pressure chambers containing a fluid mixture configured to boil at one or more temperature. For example, chip assembly 250A may be attached to a pressure chamber A configured to facilitate two-phase cooling to cool chip assembly 250A, and chip assembly 250N may be attached to a pressure chamber N configured to facilitate two-phase cooling to cool chip assembly 250N. In some examples, the hermetically sealed pressure chambers may only be attached to high TDP components. During operation, the components with attached pressure chambers may be cooled via two-phase cooling of the fluid mixture within the attached pressure chambers, and the pressure chambers may be cooled via single-phase cooling of technical fluid 248. Although only chip assemblies A-N are depicted, it is understood that other server components may be immersed within technical fluid 248 and be cooled thereby. It is also understood that other server components may be disposed within or external to immersion box 240, and that any one or more of the components may be attached to a corresponding pressure chamber.

In some examples, while other components are immersed within technical fluid 248, chip assemblies A-N may be surrounded by one or more cooling chambers in fluid communication with the cooling jacket. The same coolant that cools immersion box 240 may flow through the cooling chambers to cool the chip assemblies A-N.

Figure 3:
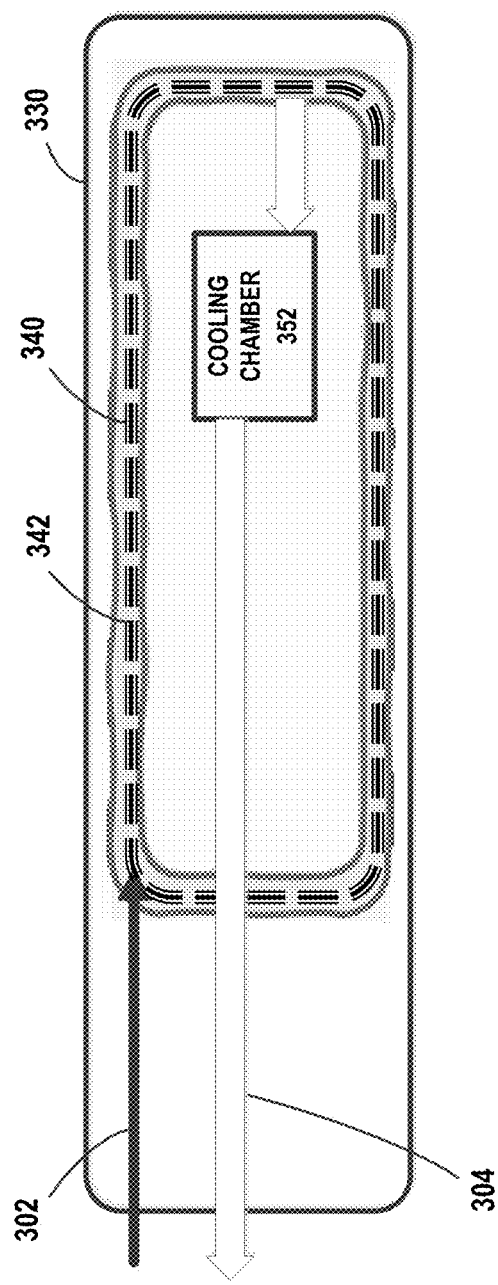
FIG. 3 is a block diagram illustrating an example cooling chamber in fluid communication with an example cooling jacket, in accordance with techniques described herein.

FIG. 3 is a block diagram illustrating example cooling chamber 352 in fluid communication with example cooling jacket 342, in accordance with techniques described herein. Although only one cooling chamber 352 is depicted, immersion box 340 may include a plurality of cooling chambers. Immersion box 340 and server 330 may be substantially similar to immersion boxes 140 and servers 130, respectively, depicted in FIG. 1A. Cooling jacket 342 may be substantially similar to cooling jacket 242 depicted in FIG. 2.

In the example of FIG. 3, cold coolant 302 flows into cooling jacket 342 of immersion box 340 and thereby cools the internals of immersion box 340. For example, cold coolant 302 may flow from a cold coolant line of a data center into immersion box 340 through a tube or other pipe fluidly connected to cooling jacket 342 of immersion box 340. Warm coolant 304 may flow out of immersion box 340 through a tube or other pipe in fluid connection with cooling jacket 342 and/or cooling chamber 352 to a warm return line of the data center.

In some examples, the coolant flows through cooling jacket 342 before flowing to cooling chamber 352, as shown in the example of FIG. 3. A tube or other pipe may fluidly connect cooling jacket 342 with cooling chamber 352. Cooling chamber 352 may surround one or more chip assemblies of server 330 within immersion box 340. Although cold coolant 302 is depicted in FIG. 3 as flowing into cooling jacket 342 before flowing into cooling chamber 352, in some examples, cold coolant 302 may flow to cooling chamber 352 before flowing through cooling jacket 342, and then out of server 330 as warm coolant 304. In some examples, cold coolant may flow to cooling chamber 352 and cooling jacket 342 in parallel, rather than passing through either cooling jacket 342 first or cooling chamber 352 first.

In some examples, immersion box 340 may be filled with a technical fluid. Heat may conduct from server components immersed in the technical fluid to the technical fluid. Heat may convect within the technical fluid. Heat may conduct from the technical fluid through the walls of immersion box 340 to the coolant within cooling jacket 342. In some examples, immersion box 340 may not be filled with technical fluid. In these examples, heat may convect within whatever fluid fills immersion box 340 (e.g., air). Coolant may flow from a heat exchange system of a data center in which server 330 is located. In the example of FIG. 3, after traveling through cooling jacket 342, coolant may flow from cooling jacket 342 to one or more cooling chambers (e.g., cooling chamber 352), before flowing out of server 330 and back to the heat exchange system of the data center as warm coolant 304.

In some examples, cooling chamber 352 surrounds part or all of one or more chip assemblies of server 330. The chip assemblies of server 330 may include heat-producing components of server 330 attached to pressure chambers that help facilitate two-phase cooling of the heat-producing components. As coolant flows through cooling chamber 352 and around the chip assembly, heat may be transferred from the chip assembly to the coolant.

Figure 4:
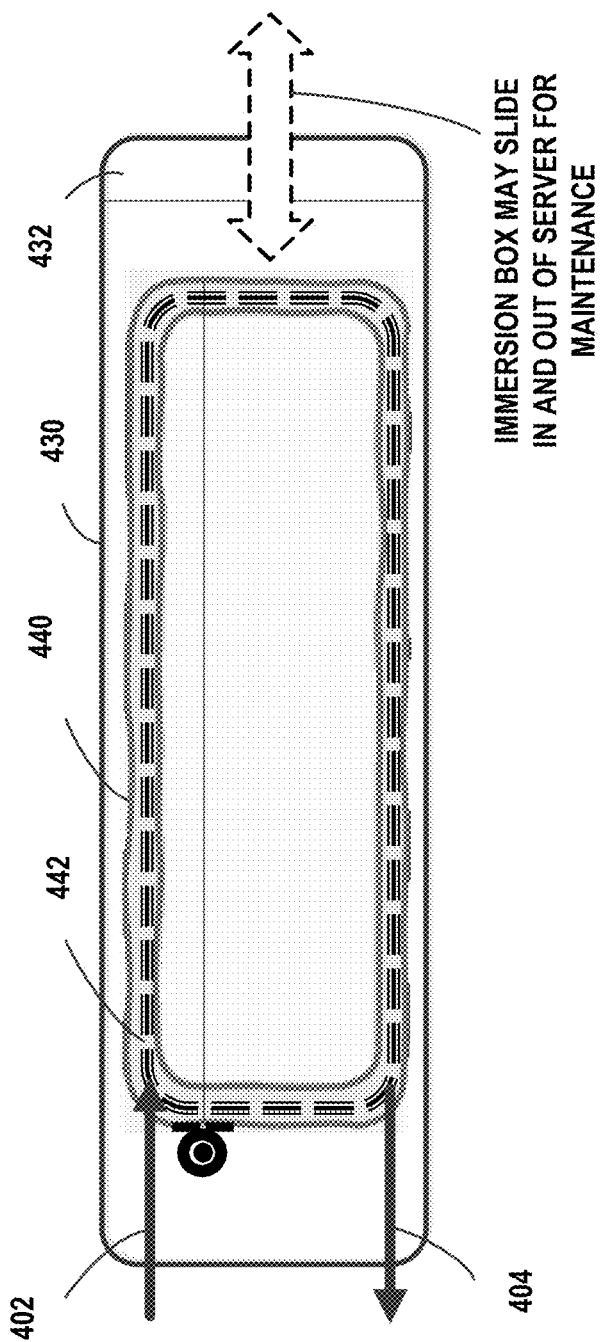
FIG. 4 is a block diagram illustrating an example server with a removable immersion box, in accordance with techniques described herein.

FIG. 4 is a block diagram illustrating example server 430 with removable immersion box 440, in accordance with techniques described herein. Immersion box 440 and server 430 may be substantially similar to immersion boxes 140 and servers 130, respectively, depicted in FIG. 1A. Cooling jacket 442 may be substantially similar to cooling jacket 242 depicted in FIG. 2.

In the example of FIG. 4, server 430 includes cover 432. In some examples cover 432 may be a vertical door or hatch that allows access to the internals of server 430. Cover 432 may be large enough that immersion box 440 may fit through cover 432. Immersion box 440 may be configured to slide in and out of server 430 for maintenance. For example, immersion box 440 may rest on rails within server 430. In some examples, the lines carrying cold coolant 402 in and warm coolant 404 out of server 430 and immersion box 440 are flexible. For example, the lines may be plastic tubes that are folded within server 430 and allow immersion box 440 to be removed a certain distance without jeopardizing connection points of the lines to immersion box 440.

FIG. 5A is a block diagram illustrating example immersion box 540 with example coolant pumps 544A-C, in accordance with techniques described herein. FIG. 5B is a block diagram illustrating example immersion box 540 of FIG. 5A with cooling coil 546 inside the immersion box, in accordance with the techniques described herein. Immersion box 540 and server 530 may be substantially similar to immersion boxes 140 and servers 130, respectively, depicted in FIG. 1A.

In some examples, cold coolant 502 that flows into server 530 from a heat exchange system of the data center does not travel through a cooling jacket within the walls of immersion box 540. In the example of FIGS. 5A and 5B, cold coolant 502 flows through coil 546 within the immersion box. Immersion box 540 may include hinge 541 and lid 543 to allow for easy access to the internals of immersion box 540. Coil 546 may be an independent structure that can be removed from or inserted into immersion box 540 when lid 543 is open. This may allow for quick installation of coil 546 and immersion box 540 in server cabinets.

One or more pumps 544A-N may be in fluid communication with coil 546 and facilitate movement of coolant through coil 546. Immersion box 540 may be filled with a technical fluid configured to cool components of server 530 inside immersion box 540. Coil 546 may be at least partially immersed within the technical fluid. As coolant flows through coil 546, the coolant may draw heat away from the technical fluid.

In some examples, one or more pumps 544A-N may be in fluid communication with the technical fluid that fills immersion box 540. The one or more pumps 544A-N may help mix the technical fluid to aid in heat transfer without relying on convection of the technical fluid alone.

Figure 6A:
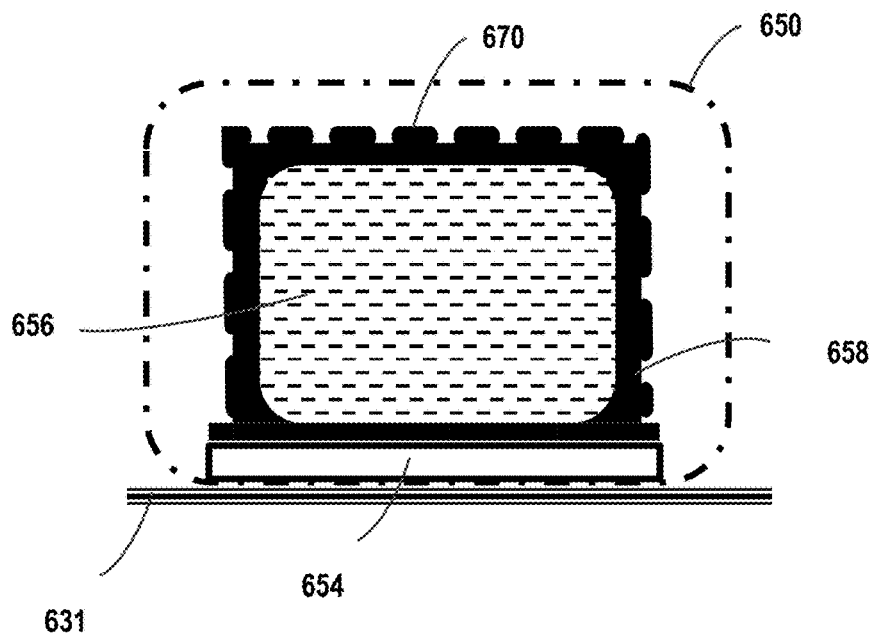
FIG. 6A is a diagram of an example chip assembly including a pressure chamber, in accordance with techniques described herein.

FIG. 6A is a diagram of an example chip assembly 650 including pressure chamber 658, in accordance with techniques described herein. In the example of FIGS. 6A and 6B, chip assembly 650 includes pressure chamber 658 attached to server component 654. Server component 654 is attached to board connection 631 for structural stability and electrical communication with the other components of the server. In some examples, pressure chamber 658 may replace the traditional air heat sink that usually is attached to components of a server. Pressure chamber 658 may be made primarily from metal or some other material capable of rapid heat transfer as well as withstanding internal pressures. Chip assembly 650 may be substantially similar to chip assemblies 150 depicted in FIG. 1A.

As the server operates, components of the server may generate significant amounts of heat and require cooling (especially high TDP components). A two-phase cooling fluid may rapidly remove heat from components of the server as the two-phase cooling fluid boils due to heat generated by the components. However, due to the Leidenfrost effect, a vapor layer may form between the components and the cooling fluid, preventing heat transfer away from the components. It is therefore desirable to mitigate the Leidenfrost effect in some way.

Pressure chamber 658 may be configured to mitigate the Leidenfrost effect. Pressure chamber 658 is filled with fluid mixture 656. Fluid mixture 656 may contain one or more fluids (e.g., coolants/refrigerants), where each fluid may be configured to boil at a different temperature, ensuring that fluid mixture 656 rapidly convects heat away from server component 654. For example, a first fluid of fluid mixture 656 may boil at a first temperature, and introduce a risk of producing a Leidenfrost effect between the first fluid and the internal walls of pressure chamber 658 directly adjacent server component 654. However, a second fluid of fluid mixture 656 may boil at a second temperature that is higher than the first temperature. The second fluid may tend to remain a fluid while some of the first fluid boils, allowing the second fluid to continue to convect normally while the some of the first fluid boils.

Including multiple fluids with multiple boiling points may increase mixing of fluid mixture 656 within pressure chamber 658, and thereby increase heat transfer away from server component 654. For example, fluid mixture 656 may contain first and second fluid as described above that boil at respective first and second temperatures. When first fluid boils, the weight of second fluid as a liquid may tend to push aside first fluid vapor to prevent a Leidenfrost effect between the first fluid and the walls of pressure chamber 658. Fluid mixture 656 also contains fine metal particles suspended within the fluid. In some examples, the metal particles may be made from metal, e.g., aluminum. The metal particles may be of varying sizes, and as the metal particles swirl within the boiling mixture, they prevent vapor layers from forming that would prevent heat transfer between surfaces. In this way, fluid mixture 656 and pressure chamber counteract the Leidenfrost effect and allow for efficient heat transfer away from server component 654 through two-phase cooling. In some examples, fluid mixture 656 may include an engineered nanofluid (e.g., Hydromx®, Maxwell™) alone, or as part of a mixture comprising fluid mixture 656.

Because many effective two-phase cooling fluids are harmful to the environment, it may be beneficial to minimize the likelihood of two-phase cooling fluid escaping to the atmosphere. Pressure chamber 658 may be hermetically sealed to prevent fluid mixture 656 from escaping. In addition, the volume of fluid mixture 656 within pressure chamber 658 is relatively low compared to systems in which the entire server chassis is submerged in a two-phase cooling fluid. Thus, in the event of a leak, a minimal amount of two-phase cooling fluid may be released. In some examples, because pressure chamber 658 is sealed, toxic substances may be used in fluid mixture 656 (e.g., mercury).

Figure 6B:
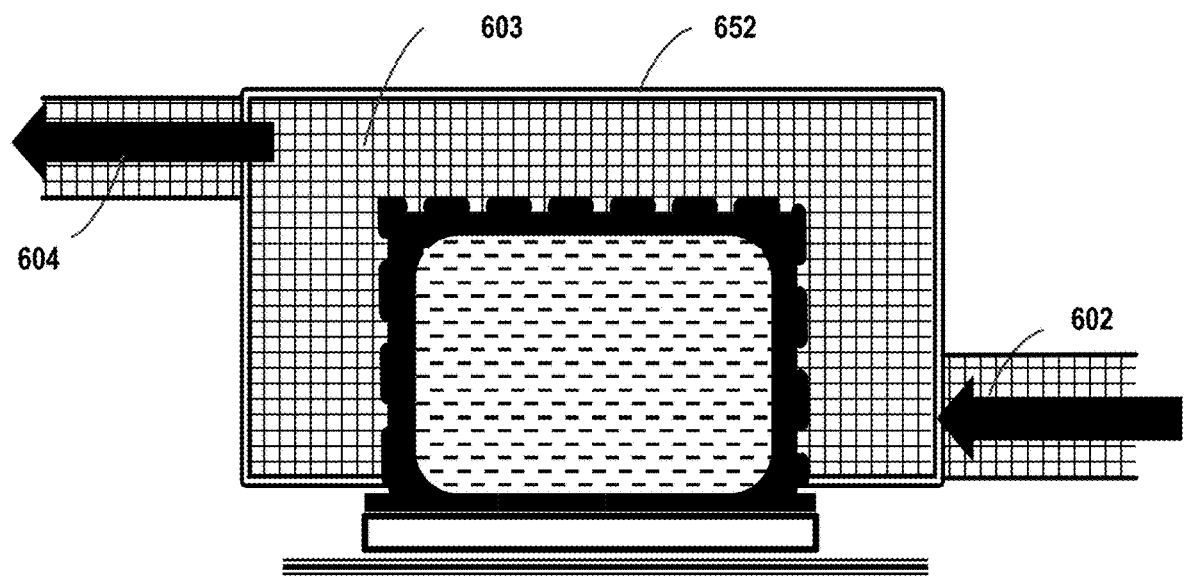
FIG. 6B is a diagram of an example cooling chamber surrounding the example chip assembly of FIG. 6A, in accordance with techniques described herein.

In the example of FIGS. 6A and 6B, pressure chamber 658 also includes fins 670 along an outside surface that aid in heat transfer away from pressure chamber 658 and into the fluid surrounding pressure chamber 658. In some examples, the internal walls of pressure chamber 658 may be scored to create micro or macro channels along the internal walls of pressure chamber 658. The channels may form one or more patterns configured to assist convective fluid flow within pressure chamber 658.

In some examples, pressure chamber 658 may include one or more pumps inside pressure chamber 658 configured to facilitate fluid flow and mixing of fluid mixture 656 within pressure chamber 658. In some examples, the one or more pumps may be electric. The one or more pumps may draw power from the electronics in close proximity to pressure chamber 658 (e.g., the electronics of server component 654 to which pressure chamber 658 is connected).

In some examples, chip assembly 650 may include one or more paddles disposed within pressure chamber 658 and connected by an axle to one or more paddles disposed outside of pressure chamber 658. As the one or more paddles disposed inside or outside of pressure chamber 658 turn on their axis, the axle translates that rotation to the corresponding connected interior or exterior paddles. For example, as coolant flows through cooling chamber 652, the coolant flow may cause one or more paddles exterior to pressure chamber 658 to spin or rotate about an axis. An axle attached at the center of the rotational axis may traverse through the wall of pressure chamber 658 to the one or more paddles interior to pressure chamber 658, and cause the interior paddles to spin or rotate as well. By causing the interior paddles to rotate, the interior paddles may facilitate mixture of fluid mixture 656 within pressure chamber 658, and thereby facilitate heat transfer away from server component 654.

Although chip assembly 650 is described in many parts of the present disclosure as within an immersion box within a server, in some examples, one or more chip assemblies (e.g., chip assembly 650) may be located outside of an immersion box. For example, hermetically sealed pressure chamber 658 may be connected to server component 654, where server component 654 is outside the immersion box. In some examples, chip assembly 650 may include pressure chamber 658 connected to a component of a data center external of the server. For example, one or more hermetically sealed pressure chambers (e.g., pressure chamber 658) may be connected to one or more components of a server cabinet, coolant distribution unit, and/or as an independent cabinet form factor.

Although only one chip assembly 650 is depicted in FIGS. 6A and 6B, in some examples any number of chip assemblies may be included in a data center. For example, a server may include a hermetically-sealed pressure chamber filled with fluid mixture 656 attached to a CPU of the server forming a first chip assembly and a pressure chamber attached to a GPU of the server forming a second chip assembly. In some examples, a fluid loop (e.g., tube with facility water or other coolant) may fluidly connect a plurality of cooling chambers (e.g., cooling chamber 652) surrounding a plurality of chip assemblies (e.g., chip assembly 650), regardless of the location of each of the plurality of chip assemblies.

In some examples, pressure chamber 658 may be immersed in a single- or two-phase cooling fluid. FIG. 6B is a diagram of example cooling chamber 652 surrounding the example chip assembly of FIG. 6A, in accordance with techniques described herein. Cooling chamber 652 may completely surround pressure chamber 658, and be filled with circulating coolant 603 to continually cool pressure chamber 658. Cold coolant 602 may flow into cooling chamber 652, be warmed by pressure chamber 658, and flow out of cooling chamber 652 as warm coolant 604, and back to a heat exchange system of a data center in which chip assembly 650 is located. Coolant 603 may be a single-phase or two-phase cooling fluid. Fins 670 on the outside of pressure chamber 658 may aid in heat transfer from pressure chamber 658 to coolant 603.

Because fluid mixture 656 is fully contained within pressure chamber 658, it may be effective in transferring heat from server component 654 to coolant 603 in cooling chamber 652, regardless of the type of coolant 603 in cooling chamber 652. Therefore, pressure chambers as disclosed may be integrated into a multitude of existing systems without significant changes to the system itself.

In this way, the present disclosure may combine the benefits of two-phase cooling, single-phase cooling, and DTC cooling without incurring many of the detriments usually associated with one or more of the methods.

FIG. 7 is a flowchart illustrating an example method of cooling components of a computing device, in accordance with techniques described herein. The method of FIG. 7 will be described with reference to FIGS. 2A-6B.

The method may include cooling a component of a computing device via a chip assembly positioned within a chassis of the computing device, wherein the chip assembly includes the component and a pressure chamber adjacent to the component (702). The pressure chamber may be hermetically sealed and contain a fluid mixture configured to facilitate convective cooling of the component. For example, the fluid mixture may facilitate convective cooling of the wall of the pressure chamber directly adjacent to the component, and thereby also cool the component.

In some examples, the computing device may be a server (e.g., server 230 of FIG. 2A), containing an immersion box (e.g., immersion box 240) configured to cool components of the server. A cooling jacket of immersion box 240 may be in fluid communication with a heat exchange system of a data center in which server 230 is housed. Some components of server 230 may be housed by immersion box 240 (internal components 234), while other components of server 230 remain outside of immersion box 240 (external components 232). Internal components 234 may include CPUs, GPUs, memory modules, and other heat-producing components of server 230. External components 232 may include components of server 230 that produce negligible heat, or that may not function within immersion box 240. For example, immersion box 240 may be filled with a technical fluid (e.g., an immersion fluid) with a different refractive index than air, and optical components of server 230 may not function properly when immersed in the technical fluid, therefore external components may include the optical components of server 230. Any of external components 232 or internal components 234 may be attached to a corresponding pressure chamber, wherein the pressure chamber is hermetically sealed and filled with a fluid mixture configured to facilitate two-phase cooling of the attached component.

In the example of FIG. 2A, cold coolant 202 flows into immersion box 240 from the data center's heat exchange system, and warm coolant 204 flows out of immersion box 240 back to the data center's heat exchange system. Cold coolant 202 may flow from a cold coolant line of a data center into immersion box 240 through a tube fluidly connected to cooling jacket 242 of immersion box 240. Warm coolant 204 may flow out of immersion box 240 through a tube in fluid connection with cooling jacket 242 to a warm return line of the data center. Immersion box 240 includes cooling jacket 242 through which the coolant may flow and thereby transfer heat away from immersion box 240 internals. Cooling jacket 242 may be located at an exterior of immersion box 240. For example, cooling jacket 242 may be located within the walls of immersion box 240. In some examples, cooling jacket 242 may be located along inner surfaces of immersion box 240.

In some examples, immersion box 240 may have a clam-shell design, where immersion box 240 includes a hinge and lid for easy access to internals of immersion box 240. In examples where immersion box 240 is filled with a technical fluid, the technical fluid may only come up to the level of the lid or just below to prevent leakage during operation and maintenance. The technical fluid may be any technical fluid, e.g., refrigerant, coolant, dielectric fluid, natural mineral oils, engineered ester-based fluids, etc.

With reference to FIG. 2B, in some examples, chip assemblies 250 may include high TDP components. In some examples, chip assemblies 250 may be attached to pressure chambers containing a fluid mixture configured to boil at one or more temperatures. For example, chip assembly 250A may be attached to a pressure chamber A configured to facilitate two-phase cooling to cool chip assembly 250A, and chip assembly 250N may be attached to a pressure chamber N configured to facilitate two-phase cooling to cool chip assembly 250N. In some examples, the hermetically sealed pressure chambers may only be attached to high TDP components. During operation, the components with attached pressure chambers may be cooled via two-phase cooling of the fluid mixture within the attached pressure chambers, and the pressure chambers may be cooled via single-phase cooling of technical fluid 248. Although only chip assemblies A-N are depicted, it is understood that other server components may be immersed within technical fluid 248 and be cooled thereby. It is also understood that other server components may be disposed within or external to immersion box 240, and that any one or more of the components may be attached to a corresponding pressure chamber.

In some examples, while other components are immersed within technical fluid 248, chip assemblies A-N may be surrounded by one or more cooling chambers in fluid communication with the cooling jacket. The same coolant that cools immersion box 240 may flow through the cooling chambers to cool the chip assemblies A-N.

In the example of FIG. 3, cold coolant 302 flows into cooling jacket 342 of immersion box 340 and thereby cools the internals of immersion box 340. For example, cold coolant 302 may flow from a cold coolant line of a data center into immersion box 340 through a tube or other pipe fluidly connected to cooling jacket 342 of immersion box 340. Warm coolant 304 may flow out of immersion box 340 through a tube or other pipe in fluid connection with cooling jacket 342 and/or cooling chamber 352 to a warm return line of the data center.

In some examples, the coolant flows through cooling jacket 342 before flowing to cooling chamber 352, as shown in the example of FIG. 3. A tube or other pipe may fluidly connect cooling jacket 342 with cooling chamber 352. Cooling chamber 352 may surround one or more chip assemblies of server 330 within immersion box 340. Although cold coolant 302 is depicted in FIG. 3 as flowing into cooling jacket 342 before flowing into cooling chamber 352, in some examples, cold coolant 302 may flow to cooling chamber 352 before flowing through cooling jacket 342, and then out of server 330 as warm coolant 304. In some examples, cold coolant may flow to cooling chamber 352 and cooling jacket 342 in parallel, rather than passing through either cooling jacket 342 first or cooling chamber 352 first.

In some examples, immersion box 340 may be filled with a technical fluid. Heat may conduct from server components immersed in the technical fluid to the technical fluid. Heat may convect within the technical fluid. Heat may conduct from the technical fluid through the walls of immersion box 340 to the coolant within cooling jacket 342. In some examples, immersion box 340 may not be filled with technical fluid. In these examples, heat may convect within whatever fluid fills immersion box 340 (e.g., air). Coolant may flow from a heat exchange system of a data center in which server 330 is located. In the example of FIG. 3, after traveling through cooling jacket 342, coolant may flow from cooling jacket 342 to one or more cooling chambers (e.g., cooling chamber 352), before flowing out of server 330 and back to the heat exchange system of the data center as warm coolant 304.

In some examples, cooling chamber 352 surrounds part or all of one or more chip assemblies of server 330. The chip assemblies of server 330 may include heat-producing components of server 330 attached to pressure chambers that help facilitate two-phase cooling of the heat-producing components. As coolant flows through cooling chamber 352 and around the chip assembly, heat may be transferred from the chip assembly to the coolant.

In the example of FIG. 4, server 430 includes cover 432. In some examples cover 432 may be a vertical door or hatch that allows access to the internals of server 430. Cover 432 may be large enough that immersion box 440 may fit through cover 432. Immersion box 440 may be configured to slide in and out of server 430 for maintenance. For example, immersion box 440 may rest on rails within server 430. In some examples, the lines carrying cold coolant 402 in and warm coolant 404 out of server 430 and immersion box 440 are flexible. For example, the lines may be plastic tubes that are folded within server 430 and allow immersion box 440 to be removed a certain distance without jeopardizing connection points of the lines to immersion box 440.

In the example of FIGS. 5A-5B, cold coolant 502 that flows into server 530 from a heat exchange system of the data center does not travel through a cooling jacket within the walls of immersion box 540. In the example of FIGS. 5A and 5B, cold coolant 502 flows through coil 546 within the immersion box. Immersion box 540 may include hinge 541 and lid 543 to allow for easy access to the internals of immersion box 540. Coil 546 may be an independent structure that can be removed from or inserted into immersion box 540 when lid 543 is open. This may allow for quick installation of coil 546 and immersion box 540 in server cabinets.

One or more pumps 544A-N may be in fluid communication with coil 546 and facilitate movement of coolant through coil 546. Immersion box 540 may be filled with a technical fluid configured to cool components of server 530 inside immersion box 540. Coil 546 may be at least partially immersed within the technical fluid. As coolant flows through coil 546, the coolant may draw heat away from the technical fluid.

In some examples, one or more pumps 544A-N may be in fluid communication with the technical fluid that fills immersion box 540. The one or more pumps 544A-N may help mix the technical fluid to aid in heat transfer without relying on convection of the technical fluid alone.

In the example of FIGS. 6A and 6B, chip assembly 650 includes pressure chamber 658 attached to server component 654. Server component 654 is attached to board connection 631 for structural stability and electrical communication with the other components of the server. In some examples, pressure chamber 658 may replace the traditional air heat sink that usually is attached to components of a server. Pressure chamber 658 may be made primarily from metal or some other material capable of rapid heat transfer as well as withstanding internal pressures. Chip assembly 650 may be substantially similar to chip assemblies 150 depicted in FIG. 1A.

As the server operates, components of the server may generate significant amounts of heat and require cooling (especially high TDP components). A two-phase cooling fluid may rapidly remove heat from components of the server as the two-phase cooling fluid boils due to heat generated by the components. However, due to the Leidenfrost effect, a vapor layer may form between the components and the cooling fluid, preventing heat transfer away from the components. It is therefore desirable to mitigate the Leidenfrost effect in some way.

Pressure chamber 658 may be configured to mitigate the Leidenfrost effect. Pressure chamber 658 is filled with fluid mixture 656. Fluid mixture 656 may contain one or more fluids (e.g., coolants/refrigerants), where each fluid may be configured to boil at a different temperature, ensuring that fluid mixture 656 rapidly convects heat away from server component 654. For example, a first fluid of fluid mixture 656 may boil at a first temperature, and introduce a risk of producing a Leidenfrost effect between the first fluid and the internal walls of pressure chamber 658 directly adjacent server component 654. However, a second fluid of fluid mixture 656 may boil at a second temperature that is higher than the first temperature. The second fluid may tend to remain a fluid while some of the first fluid boils, allowing the second fluid to continue to convect normally while the some of the first fluid boils.

Including multiple fluids with multiple boiling points may increase mixing of fluid mixture 656 within pressure chamber 658, and thereby increase heat transfer away from server component 654. For example, fluid mixture 656 may contain first and second fluid as described above that boil at respective first and second temperatures. When first fluid boils, the weight of second fluid as a liquid may tend to push aside first fluid vapor to prevent a Leidenfrost effect between the first fluid and the walls of pressure chamber 658. Fluid mixture 656 also contains fine metal particles suspended within the fluid. In some examples, the metal particles may be made from metal, e.g., aluminum. The metal particles may be of varying sizes, and as the metal particles swirl within the boiling mixture, they prevent vapor layers from forming that would prevent heat transfer between surfaces. In this way, fluid mixture 656 and pressure chamber counteract the Leidenfrost effect and allow for efficient heat transfer away from server component 654 through two-phase cooling. In some examples, fluid mixture 656 may include an engineered nanofluid (e.g., Hydromx®, Maxwell™) alone, or as part of a mixture comprising fluid mixture 656.

Because many effective two-phase cooling fluids are harmful to the environment, it may be beneficial to minimize the likelihood of two-phase cooling fluid escaping to the atmosphere. Pressure chamber 658 may be hermetically sealed to prevent fluid mixture 656 from escaping. In addition, the volume of fluid mixture 656 within pressure chamber 658 is relatively low compared to systems in which the entire server chassis is submerged in a two-phase cooling fluid. Thus, in the event of a leak, a minimal amount of two-phase cooling fluid may be released. In some examples, because pressure chamber 658 is sealed, toxic substances may be used in fluid mixture 656 (e.g., mercury).

In the example of FIGS. 6A and 6B, pressure chamber 658 also includes fins 670 along an outside surface that aid in heat transfer away from pressure chamber 658 and into the fluid surrounding pressure chamber 658. In some examples, the internal walls of pressure chamber 658 may be scored to create micro or macro channels along the internal walls of pressure chamber 658. The channels may form one or more patterns configured to assist convective fluid flow within pressure chamber 658.

In some examples, pressure chamber 658 may include one or more pumps inside pressure chamber 658 configured to facilitate fluid flow and mixing of fluid mixture 656 within pressure chamber 658. In some examples, the one or more pumps may be electric. The one or more pumps may draw power from the electronics in close proximity to pressure chamber 658 (e.g., the electronics of server component 654 to which pressure chamber 658 is connected).

In some examples, chip assembly 650 may include one or more paddles disposed within pressure chamber 658 and connected by an axle to one or more paddles disposed outside of pressure chamber 658. As the one or more paddles disposed inside or outside of pressure chamber 658 turn on their axis, the axle translates that rotation to the corresponding connected interior or exterior paddles. For example, as coolant flows through cooling chamber 652, the coolant flow may cause one or more paddles exterior to pressure chamber 658 to spin or rotate about an axis. An axle attached at the center of the rotational axis may traverse through the wall of pressure chamber 658 to the one or more paddles interior to pressure chamber 658, and cause the interior paddles to spin or rotate as well. By causing the interior paddles to rotate, the interior paddles may facilitate mixture of fluid mixture 656 within pressure chamber 658, and thereby facilitate heat transfer away from server component 654.

Although chip assembly 650 is described in many parts of the present disclosure as within an immersion box within a server, in some examples, one or more chip assemblies (e.g., chip assembly 650) may be located outside of an immersion box. For example, hermetically sealed pressure chamber 658 may be connected to server component 654, where server component 654 is outside the immersion box. In some examples, chip assembly 650 may include pressure chamber 658 connected to a component of a data center external of the server. For example, one or more hermetically sealed pressure chambers (e.g., pressure chamber 658) may be connected to one or more components of a server cabinet, coolant distribution unit, and/or as an independent cabinet form factor.

Although only one chip assembly 650 is depicted in FIGS. 6A and 6B, in some examples any number of chip assemblies may be included in a data center. For example, a server may include a hermetically-sealed pressure chamber filled with fluid mixture 656 attached to a CPU of the server forming a first chip assembly and a pressure chamber attached to a GPU of the server forming a second chip assembly. In some examples, a fluid loop (e.g., tube with facility water or other coolant) may fluidly connect a plurality of cooling chambers (e.g., cooling chamber 652) surrounding a plurality of chip assemblies (e.g., chip assembly 650), regardless of the location of each of the plurality of chip assemblies.

In some examples, pressure chamber 658 may be immersed in a single- or two-phase cooling fluid. FIG. 6B is a diagram of example cooling chamber 652 surrounding the example chip assembly of FIG. 6A, in accordance with techniques described herein. Cooling chamber 652 may completely surround pressure chamber 658, and be filled with circulating coolant 603 to continually cool pressure chamber 658. Cold coolant 602 may flow into cooling chamber 652, be warmed by pressure chamber 658, and flow out of cooling chamber 652 as warm coolant 604, and back to a heat exchange system of a data center in which chip assembly 650 is located. Coolant 603 may be a single-phase or two-phase cooling fluid. Fins 670 on the outside of pressure chamber 658 may aid in heat transfer from pressure chamber 658 to coolant 603.

Because fluid mixture 656 is fully contained within pressure chamber 658, it may be effective in transferring heat from server component 654 to coolant 603 in cooling chamber 652, regardless of the type of coolant 603 in cooling chamber 652. Therefore, pressure chambers as disclosed may be integrated into a multitude of existing systems without significant changes to the system itself.

The following describes some example techniques that may be used separately or together.

Example 1: A system, including: a computing device including a chassis and one or more components; and a chip assembly positioned within the chassis, the chip assembly including: at least one component of the one or more components of the computing device; and a pressure chamber adjacent to the at least one component, wherein the pressure chamber is hermetically sealed and contains a fluid mixture configured to facilitate convective cooling of the at least one component. Various examples have been described. These and other examples are within the scope of the following claims.

What is claimed is:

1. A system, comprising:
a computing device comprising a chassis and one or more components;
an immersion box within the chassis of the computing device and surrounding the one or more components of the computing device, wherein the immersion box is filled with a fluid;
a chip assembly positioned within the immersion box, the chip assembly comprising:
at least one component of the one or more components of the computing device; and
a pressure chamber adjacent to the at least one component, wherein the pressure chamber is hermetically sealed and contains a fluid mixture configured to facilitate convective cooling of the chip assembly including the at least one component; and
a cooling chamber positioned within the immersion box and surrounding the pressure chamber,
wherein the immersion box comprises a cooling jacket positioned within walls of the immersion box, the cooling jacket configured to receive coolant from a cold coolant line and allow the coolant to flow through the cooling jacket to facilitate cooling of the one or more components within the immersion box, and
wherein the cooling chamber is in fluid communication with the cooling jacket.

2. The system of claim 1, wherein the fluid mixture comprises a plurality of metal particles in suspension.

3. The system of claim 1, wherein the at least one component comprises a high thermal design power component.

4. The system of claim 1, wherein the fluid mixture is configured to facilitate one or more of single-phase cooling or two-phase cooling of the at least one component.

5. The system of claim 1,
wherein the cooling chamber is configured to receive the coolant from the cooling jacket to facilitate cooling of the pressure chamber, and
wherein a warm coolant return line is configured to receive the coolant from the cooling chamber.

6. The system of claim 1, wherein the chip assembly comprises a first chip assembly, the pressure chamber comprises a first pressure chamber, the cooling chamber comprises a first cooling chamber, and the fluid mixture comprises a first fluid mixture, and wherein the system further comprises:
a plurality of chip assemblies that includes the first chip assembly, wherein each chip assembly of the plurality of chip assemblies is positioned within the chassis, each chip assembly comprising:
a corresponding component of the one or more components of the computing device; and a corresponding pressure chamber adjacent to the corresponding component, wherein the corresponding pressure chamber is hermetically sealed and contains a corresponding fluid mixture configured to facilitate convective cooling of the corresponding component.

7. The system of claim 1,
wherein the cooling chamber is configured to allow the coolant to flow through the cooling chamber to facilitate cooling of the pressure chamber,
wherein the cooling jacket is configured to:
receive the coolant from the cooling chamber; and
facilitate cooling of the one or more components within the immersion box, and
wherein a warm coolant return line is configured to receive the coolant from the cooling jacket.

8. The system of claim 1,
wherein the cooling chamber is configured to allow the coolant to flow through the cooling chamber to facilitate cooling of the pressure chamber,
the cooling jacket configured to receive coolant from a cold coolant line, in parallel with the cooling chamber, and allow the coolant to flow through the cooling jacket to facilitate cooling of the one or more components within the immersion box, and
wherein a warm coolant return line is configured to receive the coolant from the cooling jacket and the cooling chamber.

9. The system of claim 1, wherein the fluid filling the immersion box is configured to facilitate single-phase cooling of the one or more components within the immersion box.

10. The system of claim 1, wherein the pressure chamber comprises one or more fins on an exterior of the pressure chamber to facilitate heat transfer from the pressure chamber to the coolant.

11. A chip assembly, comprising:
at least one component of a plurality of components of a computing device; and
a pressure chamber adjacent to the at least one component, wherein the pressure chamber is hermetically sealed and contains a fluid mixture configured to facilitate convective cooling of the chip assembly including the at least one component,
wherein the pressure chamber is surrounded by a cooling chamber positioned within an immersion box that surrounds the at least one component, wherein the immersion box is filled with a fluid and comprises a cooling jacket positioned within walls of the immersion box, the cooling jacket configured to receive coolant from a cold coolant line and allow the coolant to flow through the cooling jacket to facilitate cooling of the at least one component, and wherein the cooling chamber is in fluid communication with the cooling jacket.

12. The chip assembly of claim 11, wherein the fluid mixture comprises a plurality of metal particles in suspension.

13. The chip assembly of claim 11, wherein the at least one component comprises a high thermal design power component.

14. The chip assembly of claim 11, wherein the chip assembly is positioned within a chassis of the computing device.

15. The chip assembly of claim 11, wherein the chip assembly is positioned outside a chassis of the computing device.

16. A method comprising:
receiving, by a cooling jacket positioned within walls of an immersion box, coolant from a cold coolant line to allow the coolant to flow through the cooling jacket to facilitate cooling within the immersion box, wherein the immersion box surrounds one or more components of a computing device; and
cooling at least one component of the one or more components of the computing device via a chip assembly positioned within a chassis of the computing device, wherein the chip assembly comprises:
at least one component of the one or more components of the computing device; and
a pressure chamber adjacent to the at least one component, wherein the pressure chamber is hermetically sealed and contains a fluid mixture configured to facilitate convective cooling of the chip assembly including the at least one component,
wherein the pressure chamber is surrounded by a cooling chamber positioned within the immersion box, wherein the immersion box is filled with a fluid, and wherein the cooling chamber is in fluid communication with the cooling jacket.

17. The method of claim 16, wherein the fluid mixture comprises a plurality of metal particles in suspension.

18. The method of claim 16, wherein the fluid mixture is configured to facilitate one or more of single-phase cooling or two-phase cooling of the at least one component.

19. The method of claim 16, wherein the fluid mixture is configured to mitigate a Leidenfrost effect between the fluid mixture and a wall of the pressure chamber adjacent to the at least one component.

20. The method of claim 16, further comprising receiving, by the cooling chamber, the coolant from the cooling jacket to facilitate cooling of the pressure chamber.

\* \* \* \* \*